(12) United States Patent
Chang

(10) Patent No.: US 6,736,192 B2
(45) Date of Patent: May 18, 2004

(54) CPU COOLER

(75) Inventor: Shyy-Woei Chang, Kaohsiung (TW)

(73) Assignee: Ting-Fei Wang, Kaohsiung (TW)

( * ) Notice: Subject to any disclaimer, the term of this patent is extended or adjusted under 35 U.S.C. 154(b) by 146 days.

(21) Appl. No.: 10/093,014

(22) Filed: Mar. 8, 2002

(65) Prior Publication Data

US 2003/0168202 A1 Sep. 11, 2003

(51) Int. Cl.$^7$ ................................................ F28F 7/00
(52) U.S. Cl. .................. 165/80.3; 165/80.1; 165/47; 165/908; 361/697; 361/695
(58) Field of Search .................. 165/47, 80.1, 80.3, 165/908, 121; 361/687, 690, 691, 692, 693, 694, 695, 696, 697, 702

(56) References Cited

U.S. PATENT DOCUMENTS

| | | | | |
|---|---|---|---|---|
| 2,394,060 A | * | 2/1946 | Holmes | 165/908 X |
| 3,450,199 A | * | 6/1969 | Warrell | 165/908 X |
| 4,399,484 A | * | 8/1983 | Mayer | 165/908 X |
| 5,304,845 A | * | 4/1994 | Lindquist et al. | 165/80.3 |
| 5,353,865 A | * | 10/1994 | Adiutori et al. | 165/908 X |
| 5,421,402 A | * | 6/1995 | Lin | 165/80.3 |
| 5,576,932 A | * | 11/1996 | Bishop et al. | 361/697 |
| 5,584,339 A | * | 12/1996 | Hong | 165/80.3 |
| 5,724,228 A | * | 3/1998 | Lee | 165/80.3 X |
| 5,867,365 A | * | 2/1999 | Chiou | 361/690 |
| 5,884,691 A | * | 3/1999 | Batchelder | 165/80.3 |
| 5,896,917 A | * | 4/1999 | Lemont et al. | 165/80.3 |
| 6,023,413 A | * | 2/2000 | Umezawa | 361/697 |
| 6,067,227 A | * | 5/2000 | Katsui et al. | 361/695 |
| 6,172,872 B1 | * | 1/2001 | Katsui | 361/695 |
| 6,237,344 B1 | * | 5/2001 | Lee | 165/908 X |
| 6,334,480 B1 | * | 1/2002 | Lim et al. | 165/80.3 |
| 6,371,200 B1 | * | 4/2002 | Eaton | 165/80.3 |
| 6,390,188 B1 | * | 5/2002 | Chen | 165/80.3 X |
| 6,402,464 B1 | * | 6/2002 | Chiu et al. | 165/908 X |
| 6,407,920 B1 | * | 6/2002 | Jui-Yuan et al. | 165/80.3 X |
| 6,434,002 B1 | * | 8/2002 | Wei | 361/697 |
| 6,459,581 B1 | * | 10/2002 | Newton et al. | 165/80.3 X |
| 6,463,674 B1 | * | 10/2002 | Meyers et al. | |
| 6,498,724 B1 | * | 12/2002 | Chien | 361/697 X |
| 6,519,151 B2 | * | 2/2003 | Chu et al. | 165/908 X |
| 6,575,231 B1 | * | 6/2003 | Wu | 165/121 |
| 6,590,770 B1 | * | 7/2003 | Rogers et al. | 361/697 |

FOREIGN PATENT DOCUMENTS

SU         1481586 A1 *  5/1989  ................ 165/908

* cited by examiner

Primary Examiner—L V Ciric
(74) Attorney, Agent, or Firm—Alan D. Kamrath; Nikolai & Mersereau, P.A.

(57) ABSTRACT

A CPU cooler based on a flow field of impinging jet array includes a cooling base having an array of recesses on a top surface. The cooling base is disposed on a CPU. An orifice plate of a size substantially similar to the cooling base has an array of orifices with each orifice corresponding to a recess of the array of recesses. The orifice plate is spaced above the cooling base by a separation distance. A fan is secured to the CPU, with the cooling base and orifice plate being secured between the fan and the CPU. The fan when activated provides a coolant flow that produces vortical flow structures with enhanced turbulence on each recess by impinging air jets onto the recesses through the orifices corresponding to the recesses, thereby dissipating heat generated fly the running CPU.

11 Claims, 3 Drawing Sheets

CPU COOLER

FIELD OF THE INVENTION

The present invention relates to a central processing unit (CPU) cooler and more particularly to such a CPU cooler with improved characteristics.

BACKGROUND OF THE INVENTION

It is readily understood that a running CPU of a computer generates a large amount of beat flux. Conventionally, a cooler is used to control the rising temperature resulting from the running CPU to an acceptable degree so as to maintain a normal operation of the CPU and thus of the computer. A conventional CPU cooler comprises a fan, a cooling base rested disposed on the CPU, and a metal plate above the cooling base on which a plurality of parallel fins with good heat convection and/or conduction capability is attached so as to effectively dissipate heat generated by the running CPU.

It is also understood that the operating speed of a CPU has become faster and faster as technology evolves. This in turn causes high heat flux generation from a running CPU. Hence, improved dissipation of the heat generated from a running CPU is still a task under continuous pursuit. Thus, it is desirable to provide an improved CPU cooler in order to achieve such task, which is not achieved by the prior art.

SUMMARY OF THE INVENTION

It is an object of the present invention to provide a flow field based cooler for a CPU. The cooler comprises a cooling base having an ray of recesses on its top surface. The cooling base is secured on the CPU and above which an orifice plate of a size substantially similar to the cooling base and having an array of orifices each corresponding to a recess of the array of recesses is attached. A tab at each side of the cooling base is used to clamp the orifice plate and the cooling base with a predetermined separation distance. An electrical fan above the cooling base and the orifice plate is secured on the CPU. A shroud for the electrical fan encloses the cooling base, orifice plate and CPU. When the fan is operative to provide the required coolant mass flow, impinging jets are generated through the orifice plate and directed toward the recesses within which the turbulence and vorticity of wall-jet flow are enhanced, thereby dissipating the heat flux generated by the running CPU.

In one aspect of the present invention, the orifices are perpendicular to a bottom face of the orifice plate.

In another aspect of the present invention, the orifices are oblique to a bottom face of the orifice plate.

The present invention will become apparent from the following detailed description taken with the accompanying drawings.

DETAILED DESCRIPTION OF THE PREFERRED EMBODIMENTS

Figure 1:
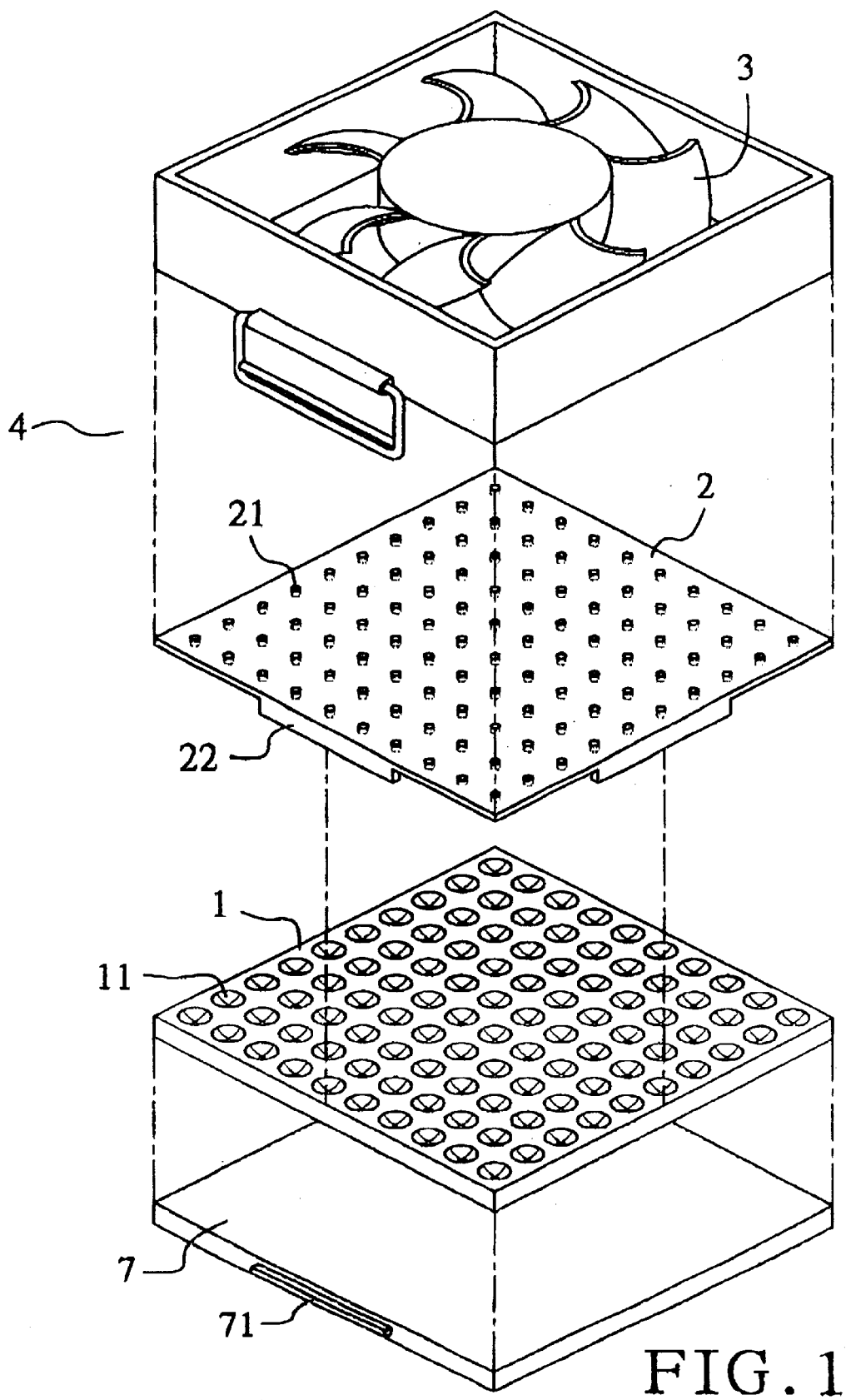
FIG. 1 is an exploded view of a first preferred embodiment of a CPU cooler according to the invention.

Referring to FIG. 1, there is shown a first preferred embodiment of a CPU cooler 4 based on a flow field of an impinging jet array in accordance with the invention. The CPU cooler 4 comprises a square cooling base 1 having an array of round recesses 11 on the top surface, with the cooling base 1 being disposed on a CPU 7. An orifice plate 2 of a size substantially similar to the cooling base 1 has a length and a width corresponding to a length and a width of the cooling base 1 and has an array of orifices 21 with each orifice of the array of orifices 21 corresponding to a recess of the array of recesses 11. The orifice plate 2 has an elongated tab 22 extending downwardly at each side of the orifice plate 2 and seated on a top surface of the cooling base 1 so that the orifice plate 2 is provided above the cooling base 1 with a predetermined separation distance. A shroud of a fan 3 with the cooling base 1 and the orifice plate 2 enclosed therein secured on a CPU 7 by latching onto side projections 71 of the CPU 7. The cooling base 1 and the orifice plate 2 are secured in between the fan 3 and the CPU 7 and the orifice plate 2 is intermediate the fan 3 and the cooling base 1 when the fan 3 is latched to the CPU 7.

Figure 2:
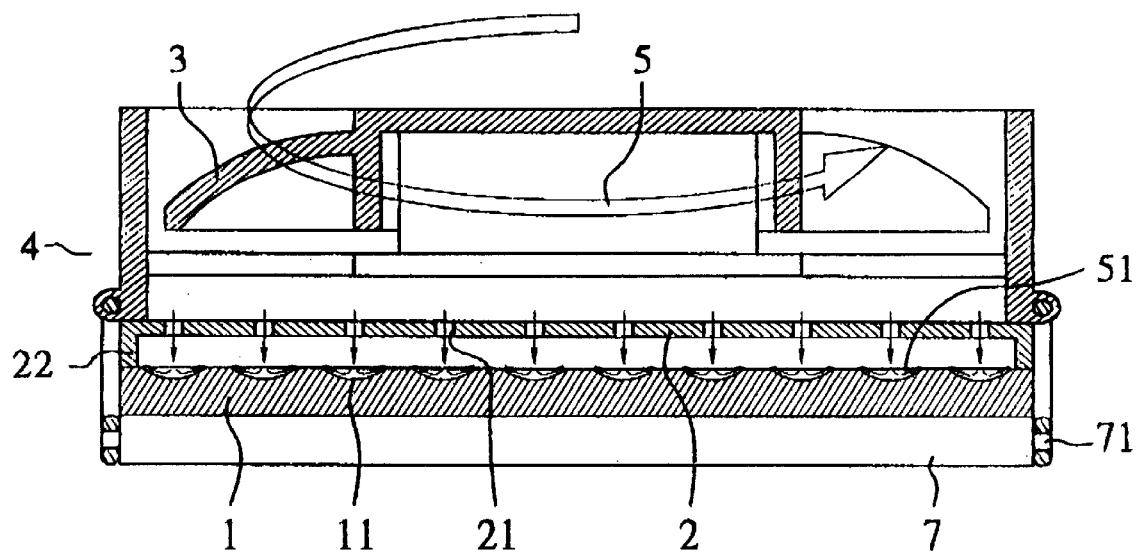
FIG. 2 is a cross-sectional view of the CPR cooler of FIG. 1 showing an air path formed in the CPU cooler while a fan is running.

Referring to FIG. 2, the operation of the invention will now be described below. The activating fan 3 generates the coolant flow with an air path 5, which in turn generates the vortical flow structures 51 on each recess 11 by impinging jets of air onto the recesses 11 through the orifices 21. Thus, the heat generated by the running CPU 7 is effectively dissipated.

Figure 3:
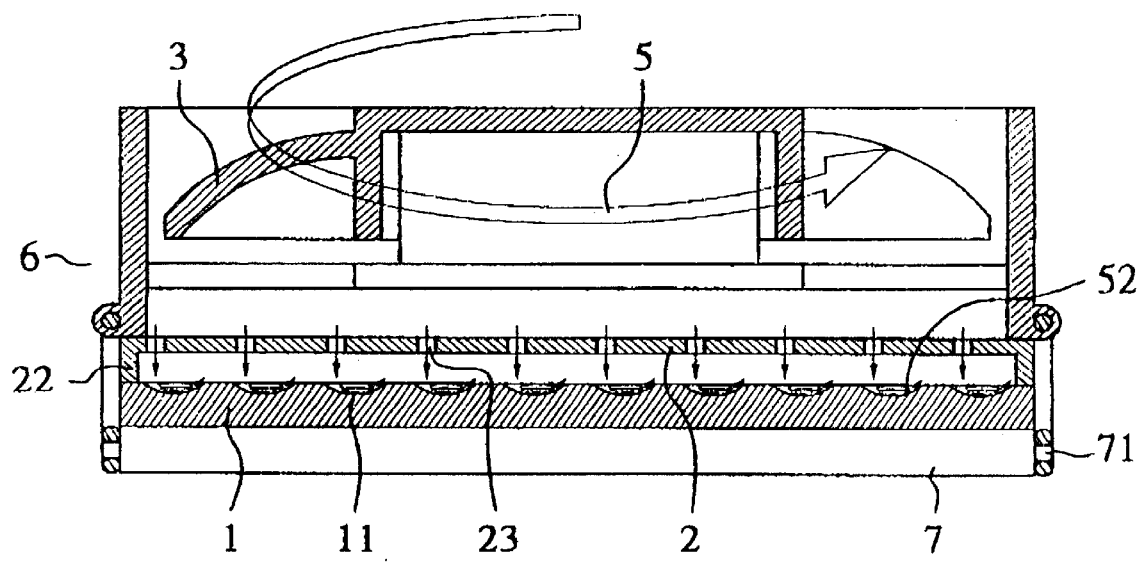
FIG. 3 is a cross-sectional view of a second preferred embodiment of the CPU cooler according to the invention showing an air path formed in the CPU cooler while the fan is running.
Figure 4:
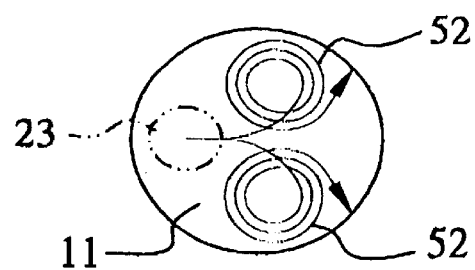
FIG. 4 is top plan view showing the vortical flow structures formed on the recess after the jet impinges onto the recess.

Referring to FIGS. 3 and 4, there is shown a cross-sectional view of a second preferred embodiment of a CPU cooler 6 according to the invention. The difference between the first and second embodiments is that the orifice 21 is disposed corresponding to the center of the recess 11 in the first embodiment while the orifice 23 is disposed corresponding to an edge of the recess 11 in the embodiment. Thus, a pair of opposite circulating vortical wall-jet flows 52 are formed on the recess 11 in the second embodiment (see FIG. 4).

Figure 5:
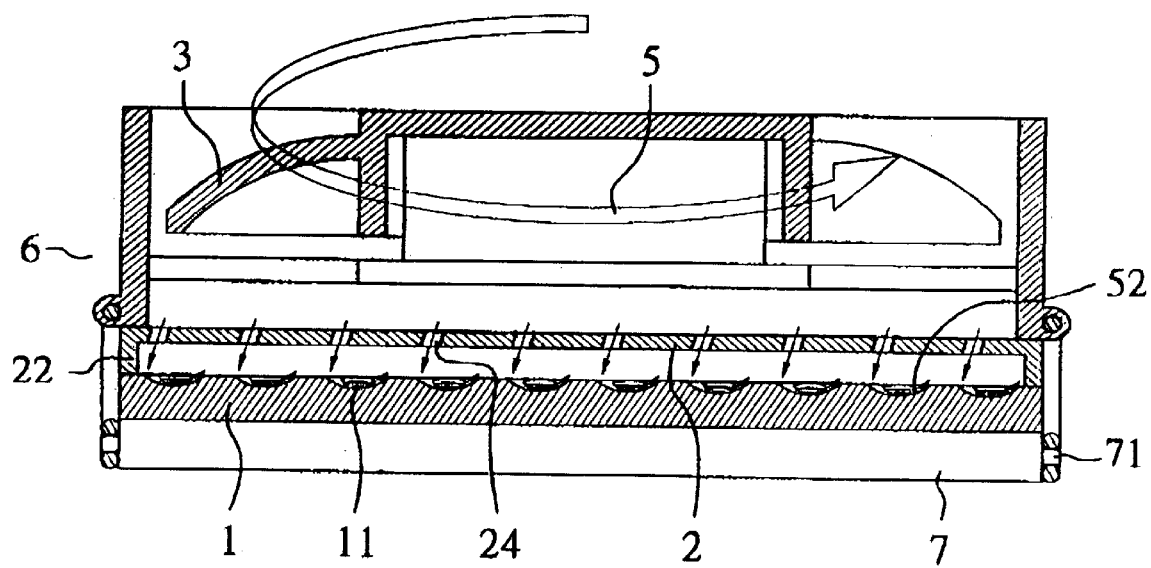
FIG. 5 is a cross-sectional view of a third preferred embodiment of the CPU cooler according to the invention showing an air path formed in the CPU cooler while the fan is running.

Referring to FIG. 5, there is shown a cross-sectional view of a third preferred embodiment of a CPU cooler 6 according to the invention. The difference between the first and the third embodiments is that the orifice 21 is perpendicular to the bottom face of the orifice plate 2 in the first embodiment while the orifice 24 is oblique to the bottom face of the orifice plate 2 in the third embodiment.

While the invention herein disclosed has been described by means of the specific embodiments, numerous modifications and variations could be made thereto by those skilled in the art without departing from the scope and spirit of the invention set forth in the claims.

What is claimed is:

1. A flow field based cooler for a CPU, the cooler comprising:

a cooling base having a top surface, a bottom surface opposite the top surface, a length and a width, with the cooling base having an array of recess recesses on the loop surface, with each recess of the array of recesses being spaced from and not interconnected with the remaining recesses of the array of recesses, with the bottom surface of the cooling base being rested disposed on the CPU;

an orifice plate having a length and a width corresponding respectively to the length and width of the cooling base, with the orifice plate having a top face and a bottom face opposite to the top face, with the orifice plate having an array of orifices, with each orifice of the array of orifices extending from the top face to the bottom face, with each orifice of the array of orifices corresponding to one of the recesses of the array of recesses, with the orifice plate having a tab at each of two opposite sides along the length of the orifice plate, with the tabs extending perpendicular from the bottom face of the orifice plate and being seated on of the cooling base so that the orifice plate is provided above the cooling base, with the orifice plate being spaced from the cooling base by a predetermined separation distance; and a fan secured to the CPU, with the cooling base and the orifice plate being intermediate the fan and the CPU and with the orifice plate being intermediate the fan and the base plate when the fan is secured on the CPU;

wherein the fan when operating generates flow from the fan through the array of orifices and into the array of recesses to generate vortical flow structures with enhanced turbulence on each recess of the array of recesses by impinging jets of air through each orifice and onto the recesses through the orifices, thereby dissipating heat generated by the running CPU.

2. The cooler of claim 1, wherein the orifices extend perpendicular to the bottom face of the orifice plate.

3. The cooler of claim 1, wherein the orifices extend oblique to the bottom face of the orifice plate.

4. The cooler of claim 1 with the top and bottom faces of the orifice plate and the top and bottom surfaces of the cooling base each being rectangular.

5. The cooler of claim 4 with the top and bottom faces of the orifice plate and the top and bottom surfaces of the cooling base each being square.

6. The cooler of claim 1 with each orifice of the array of orifices being centered over the corresponding recess of the array of recesses and generating a single vortical flow structure on the corresponding recess when the fan is operating.

7. The cooler of claim 1 with each orifice of the array of orifices being disposed off center to the corresponding recess of the array of recesses and generating a pair of opposite circulating vortical wall-jet flows on the corresponding recess when the fan is operating.

8. The cooler of claim 1 with each recess of the array of recesses having circular cross sections parallel the top surface of the cooling base.

9. The cooler of claim 1 further comprising a tab at each of two opposite ends along the width of the orifice plate, with the tabs extending perpendicular from the bottom face of the orifice plate and being seated on the top surface of the cooling base to cooperate with the tabs at the two opposite sides to hold the orifice plate above the cooling base.

10. The cooler of claim 1 wherein the fan includes a shroud, with the shroud enclosing the cooling base, the orifice plate, and the CPU.

11. The cooler of claim 10 with the CPU including projections, with the shroud of the fan latching on the projections of the CPU.

* * * * *